United States Patent [19]

Sakamoto

[11] 4,155,043

[45] May 15, 1979

[54] CHANNEL SELECTION APPARATUS INCLUDING A SCANNING SYSTEM

[75] Inventor: Yoichi Sakamoto, Takatsuki, Japan

[73] Assignee: Matsushita Electric Industrial Co. Ltd., Osaka, Japan

[21] Appl. No.: 788,402

[22] Filed: Apr. 18, 1977

[30] Foreign Application Priority Data

Apr. 28, 1976 [JP] Japan .................................. 51/49242
Sep. 13, 1976 [JP] Japan ................................ 51/110255

[51] Int. Cl.² .............................................. H04B 1/32
[52] U.S. Cl. ..................................... 325/470; 325/464
[58] Field of Search ................ 325/452, 453, 457–459, 325/464, 465, 468, 470; 334/14–16; 358/193

[56] References Cited

U.S. PATENT DOCUMENTS

| 3,940,702 | 2/1976 | Yoshimura et al. | 325/470 |
| 3,961,261 | 6/1976 | Pflasterer | 325/470 |
| 3,988,681 | 10/1976 | Schurmann | 325/470 |
| 4,004,233 | 1/1977 | Sakamoto | 325/470 |

Primary Examiner—Robert L. Griffin
Assistant Examiner—Jin F. Ng
Attorney, Agent, or Firm—Spencer & Kaye

[57] ABSTRACT

A channel selection apparatus of the scanning tuning type in which a tuning frequency is swept by a sweeping voltage to select a given tuning frequency. The sweep of the frequency is controlled for each channel by a control signal stored for each channel in the form of a number of pulses to attain exact instant tuning to a specified channel. An operating unit which compensates for temperature drift of the elements comprising the apparatus is provided to correctly compensate for temperature drift of these elements thereby attaining exact tuning.

6 Claims, 7 Drawing Figures

F I G. 6
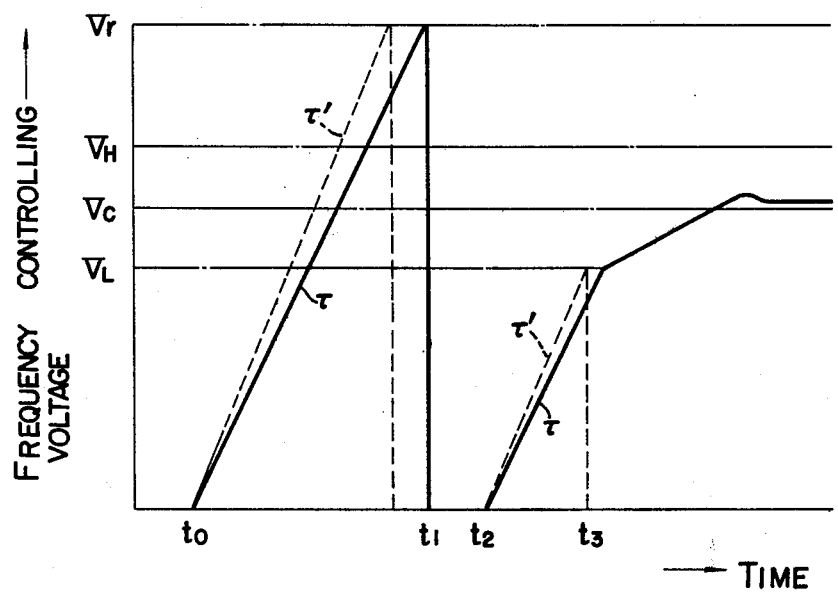

CHANNEL SELECTION APPARATUS INCLUDING A SCANNING SYSTEM

The present invention relates to a channel selection apparatus for effecting channel selection by sweeping a tuning frequency by using a sweep voltage to select a given frequency. The apparatus renders exact tuning to a specified channel frequency and also compensates for temperature drift.

Figure 2:
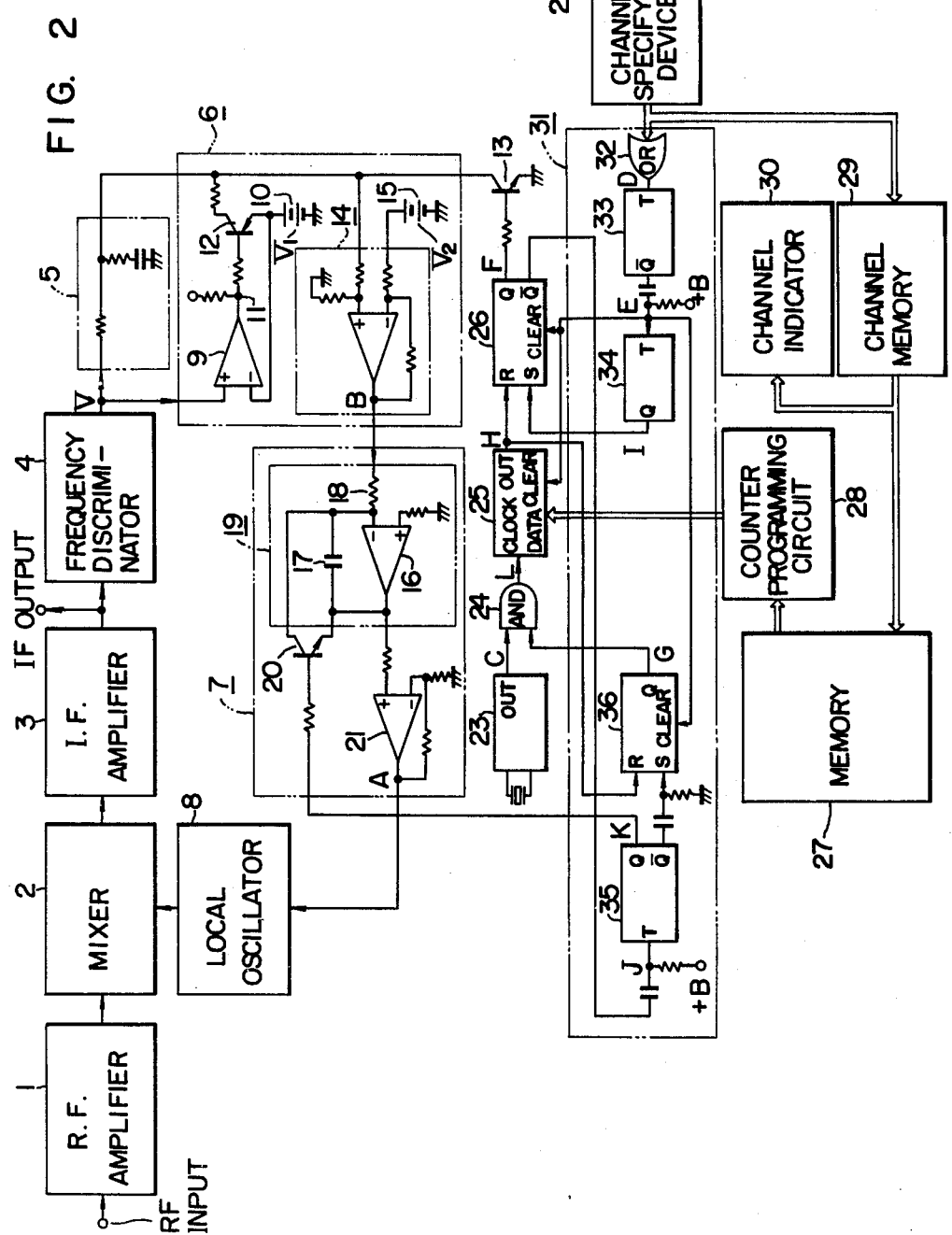
FIG. 2 shows a circuit diagram of a channel selection apparatus in accordance with one embodiment of the present invention.

FIGS. 4A, B, C, D, E, F, G, H, I, J, K and L show waveforms for explaining the operation of the apparatus of FIG. 2.

Figure 5:
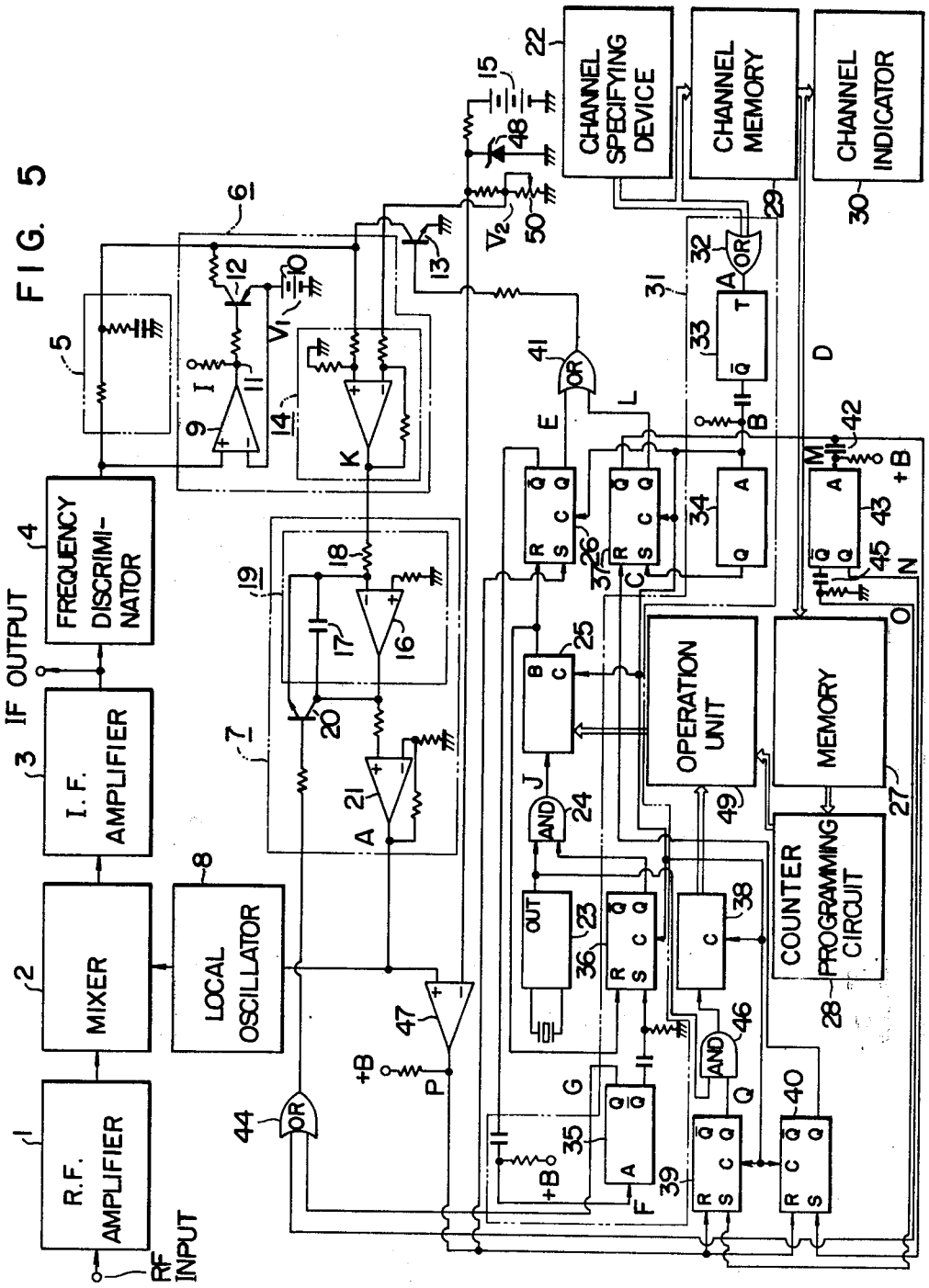

FIG. 5 is a circuit diagram of a channel selection apparatus which includes a temperature compensation means in addition to the apparatus shown in FIG. 2.

FIG. 6 and FIGS. 7A, B, C, D, L, M, N, O, P, $T_r$, $N_r$, $T_1$, $N_1$, $T_x$, $N_x$, $T_2$, $N_2$, U, E, F, G, I and K show waveforms for explaining the operation of the apparatus of FIG. 5.

Figure 1:
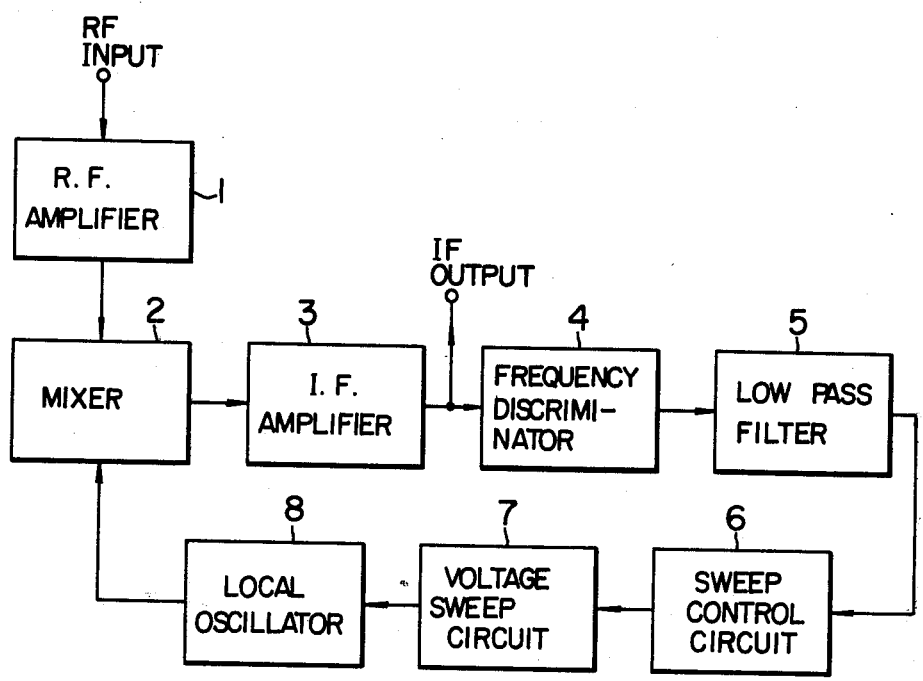
FIG. 1 shows a block diagram of a prior art channel selection apparatus.

Referring to FIG. 1, a block diagram of a prior art channel selection apparatus of the scanning tuning type is shown. In FIG. 1, 1 designates a high frequency amplifier, 2 a mixer, 3 an intermediate frequency amplifier, 4 a frequency discriminator, 5 a low pass filter, 6 a sweep control circuit, 7 a voltage sweeping circuit, and 8 a voltage controlled local oscillator, all of which are of known construction.

A channel selection apparatus for a television receiver is explained as an example. The high frequency amplifier 1 and the local oscillator 8 include a variable capacitance diode as a variable reactance element to which a sweeping voltage from the voltage sweeping circuit 7 is applied to sweep a local oscillation frequency. During the sweep, if the frequency discriminator 4 detects an intermediate frequency output signal which is produced when it is tuned to a desired broadcasting frequency, the sweep control circuit 6 makes the sweeping operation stop, and hold the tuned frequency to maintain the state of receiving continuously and thus the search tuning operation is completed.

However, since the search tuning type channel selection apparatus shown in FIG. 1 is operated to receive continuously a varying frequency, it does not include information which associates particular frequencies such as television channel frequencies with channel numbers. Therefore, in the apparatus of FIG. 1, it is difficult to select a particular frequency by specifying a channel number by a keyboard or the like or to indicate a channel number from a received channel frequency.

It is an object of the present invention to provide a channel selection apparatus of the scanning tuning type which can be used in a television receiver and which sweeps a tuning frequency by a sweeping voltage to select a given frequency, wherein the sweep of the frequency is controlled for each channel by a control signal stored for each channel so that the apparatus is instantly and exactly tuned to a specified channel.

It is another object of the present invention to provide a channel selection apparatus in which an operation unit which compensates for temperature drift of components such as capacitors, resistors, potentiometers or the like, which constitute the channel selection apparatus is included. The output of the operation unit controls a programmable counter to exactly compensate for the temperature drift of the components to attain correct tuning.

Figure 3:
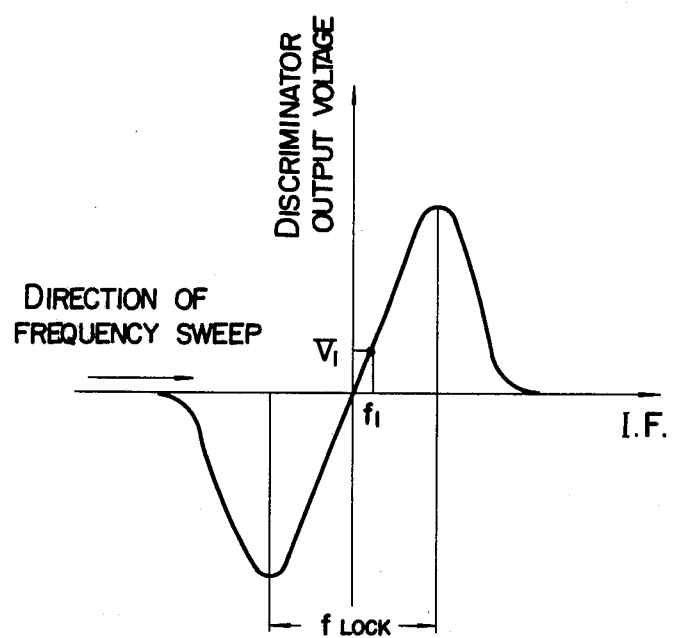
FIG. 3 shows a characteristic curve for explaining the operation of the apparatus of FIG. 2.
Figure 4:
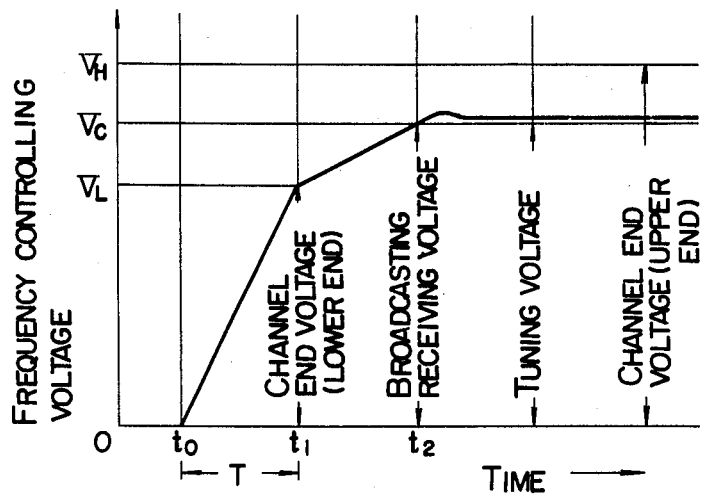
Figure 4:
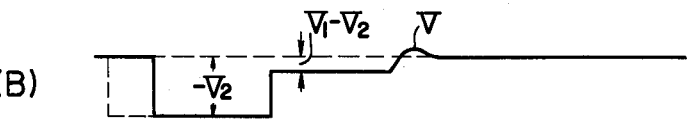
Figure 4:
Figure 4:
Figure 4:
Figure 4:
Figure 4:
Figure 4:
Figure 4:
Figure 4:
Figure 4:
Figure 4:
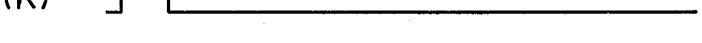

Referring to FIGS. 2 to 4, one embodiment of the channel selection apparatus of the present invention, which apparatus is not compensated for temperature drift, is explained. For the corresponding parts to those of the prior art apparatus shown in FIG. 1, the same reference numerals are used. In FIG. 2, numerals 1 to 8 are similar to those having corresponding numerals in FIG. 1.

In the sweep control circuit 6, numeral 9 denotes a voltage comparator. To the plus input terminal thereof, the discrimination output voltage V from the frequency discriminator 4 is applied while the voltage from a power supply 10 is applied to the minus input terminal. Thus, when the frequency discriminator output V is lower than the voltage $V_1$ of the power supply 10, a low level output is produced at the output terminal 11, and when V is higher than $V_1$, a high level output is produced. The voltage $V_1$ of the power supply 10 is selected to be equal to the discrimination output voltage at a frequency $f_1$ which is near the center frequency $f_o$ of the intermediate frequency on the output characteristic curve for the frequency discriminator 4 shown in FIG. 3.

Further, a transistor 12 which is turned on and off by the output of the voltage comparator 9 is inserted in series with the power supply 10, and the output terminal of the transistor 12 is connected together with the output terminal of the low pass filter 5 to the plus input terminal of a voltage subtractor 14 and is further connected to ground through a transistor 13.

Now it is assumed that the output intermediate frequency of the intermediate frequency amplifier 3 is swept from a lower frequency toward a higher frequency. When it is being swept at a low frequency which is below a pulling range shown by $f_{LOCK}$ in FIG. 3, the discrimination output voltage V of the frequency discriminator 4 is lower than $V_1$. Even after the sweep frequency reaches the range of $f_{LOCK}$, V is still lower than $V_1$ until the intermediate frequency reaches the predetermined frequency $f_1$. Therefore, within this range, the output of the voltage comparator 9 becomes low level, and the transistor 12 which is switched by the output of the voltage comparator 9 is rendered conductive so that the voltage at the junction point of the output terminals of the transistor 12 and the low pass filter 5 becomes $V_1$ irrespective of the output of the low pass filter 5. If the transistor 13 is non-conductive at this time, the voltage $V_1$ of the power supply 10 at the output of the transistor 12 is directly applied to the plus input terminal of the voltage subtractor 14.

For the sake of simplicity of explanation, it is assumed that the saturation voltage of the transistor 12 and the voltage drop across the resistor connected to the collector of the transistor 12 are small enough to be neglected. The resistance of the resistor connected to the collector is preferably selected to be sufficiently small in comparison with the input resistance of the voltage subtractor but to have a magnitude to prevent excessive current during conduction of the transistor 13.

On the other hand, a power supply 15 of a voltage $V_2$ which is greater than the voltage $V_1$ is connected to the minus input terminal of the voltage subtractor 14. Thus, in the state when the voltage $V_1$ is being applied to the plus input terminal as described above, the subtractor output voltage is equal to $(V_1-V_2)$, which is applied to a voltage integrator 19 of a Miller integrator circuit configuration comprising an amplifier 16 in the voltage sweep circuit 7, a capacitor 17 and a resistor 18. If a transistor 20 for resetting the sweep is non-conductive at the time, the voltage integrator receives the output voltage $(V_1-V_2)$ of the voltage subtractor 14 as a drive voltage input $V_S$ to carry out a voltage sweep operation and produces a sweep voltage. This sweep voltage is amplified by a voltage amplifier 21 and thence applied to the voltage controlled local oscillator 8 as a frequency controlling voltage to effect the sweep of the frequency. Under such a condition, since the inputs to the voltage subtractor 14 are $V_1$ and $V_2$ which are both constant voltages, the circuitry comprising the blocks 1 to 8 forms an open loop system so that the frequency sweep is carried out at a constant voltage sweeping speed.

The amplifier 21 may be unnecessary if the maximum output voltage of the voltage integrator 19 can be higher than the maximum applied voltage to the local oscillator 8.

Under this condition, when the sweep of intermediate frequency is carried out and when it reaches the frequency $f_1$ shown in FIG. 3, the discrimination output of the frequency discriminator 4 becomes $V_1$ and the output of the voltage comparator 9 is reversed to the high level. As a result, the transistor 12 is rendered non-conductive. When this state occurs, the input voltage to the voltage subtractor 14 is no longer the fixed voltage $V_1$ from the power supply 10 but becomes the output from the low pass filter 5, that is, the frequency controlling voltage of the automatic frequency control system, and the circuitry comprising the blocks 1 to 8 forms a closed loop. Thereafter the circuitry carries out an automatic frequency control operation in accordance with the discrimination output of the frequency discriminator 4. That is, because the circuitry assumes this state the search tuning operation is completed.

However, with only such a search tuning operation, it cannot be known to which channel the apparatus will be automatically tuned. If the frequency is swept from a lower frequency toward a higher one, the apparatus will always be tuned to the lowest frequency of the existing broadcasting frequencies and cannot be tuned to an arbitrarily specified particular channel. Thus, it becomes impossible to select or specify a channel.

In the light of the above, the present invention provides a novel channel selection apparatus wherein when a particular channel is specified the frequency is automatically swept to a frequency of each channel which frequency is preset for each of the channels so that the tuning to the broadcasting frequency of the specified channel may be made automatically and exactly.

To this end, in the illustrated embodiment, as shown in FIG. 4(A), a sweep period T from channel specifying time $t_o$ to the time $t_1$ during which the frequency controlling voltage for sweeping the frequency is swept is assigned to each channel, and it is made such that during the period T, the sweep voltage is changed to a channel voltage (channel end voltage $V_L$) which is necessary to make the tuning to the frequency of the specified channel (or end frequency thereof).

When the circuit is designed such that the frequency is swept to the channel end voltage $V_L$, the voltage sweep for search tuning in the open loop mode as described above is started from the time $t_1$ at which time the channel end voltage $V_L$ is reached, to effect the frequency sweep in a normal manner, and at the time $t_2$ the apparatus is tuned to the specified channel broadcasting frequency to complete the search tuning operation. Then, the circuit is switched to the closed loop mode to effect automatic frequency control operation so that it may be held receiving the specified channel broadcasting frequency signal. The channel voltage may not correspond to a true broadcasting channel frequency but it may be a channel end voltage corresponding to the channel end frequency of that channel, and the channel end frequency can be set at any frequency so long as the frequency range within the end frequencies does not include a carrier frequency of an adjacent channel broadcasting wave. In the case of a television receiver, for example, it may be set at any frequency provided that it does not include a video carrier frequency of an adjacent channel.

In the following description, an embodiment is explained in which the voltage sweep is not effected in one step directly to a specified channel broadcasting frequency but it is swept initially to a channel end voltage $V_L$ corresponding to a channel end frequency of the specified channel and then is swept until the apparatus is exactly tuned to the broadcasting frequency.

A change of the sweep voltage for controlling the frequency to the channel end voltage $V_L$ is effected by applying the constant amplitude voltage $V_2$ as shown in FIG. 4(B) to the voltage sweep circuit 7 only for a period T. By changing the length of the period T during which the constant amplitude voltage $-V_2$ is present from channel to channel, the magnitudes of the channel end voltages $V_L$ can be set to predetermined values which differ from channel to channel. When a channel is specified, the frequency change required to the channel end voltage $V_L$ for the specified channel is automatically determined and the voltage $-V_2$ having a duration corresponding to that frequency change is applied to the voltage sweep circuit 7. The length of the period T for which the channel end voltage specifying voltage $-V_2$ is applied is determined by counting a train of clock pulses of a constant frequency as shown in FIG. 4(C) by a counter from a channel specifying time $t_o$ and detecting a time $t_1$ at which the content of the counter reaches a count predetermined for each channel. In this manner, the length of the time period T is automatically determined for each channel. With this arrangement, the channel can be specified readily and exactly by presetting a count for each channel such that when the content of the counter reaches that count the application of the voltage $-V_2$ is stopped to terminate the period T, and specifying the preset count.

A particular construction for performing the above operation and the operation of the construction will now be explained in detail.

In order to control the application of the constant amplitude voltage $-V_2$ as shown in FIG. 4(B), the transistor 13 is provided between the plus input terminal of the voltage subtractor 14 shown in FIG. 2 and ground; that is, between the terminal to which the automatic frequency control voltage from the low pass filter 5 and the voltage $V_1$ from the transistor 12 are applied and ground. A signal as shown in FIG. 4(F) is applied to the base of the transistor 13 from the time when the channel number has been specified to the time when the time $t_1$ which is the end of the period T is detected, to render the transistor 13 conductive. When transistor 13 becomes conductive the input to the plus input terminal of the voltage subtractor 14 is driven to zero so that the voltage subtractor 14 produces the subtractor output of $-V_2$, which is applied to the voltage sweep circuit 7.

On the other hand, a transistor 20 is provided in parallel with the capacitor 17 of the voltage integrator 19. When the channel member is specified, a signal as shown in FIG. 4(K) is applied to the base of the transistor 20 to render it conductive to reset the sweep voltage and then render the transistor 20 non-conductive from the time $t_o$ to start the voltage sweep operation and the control voltage generating operation. The transistor 20 is kept non-conductive until the next time to specify a channel. Therefore, the leading edge of the period T during which the constant voltage $-V_2$ is applied is determined by the time $t_o$ when the transistor 20 is rendered non-conductive, and the trailing edge is determined by the time when the transistor 13 is rendered non-conductive.

The construction for determining the period for which the constant voltage $-V_2$ is applied, for each channel and the operation thereof are now explained.

In FIG. 2, numeral 22 denotes a channel specifying device for specifying a channel number of a broadcasting signal to be selected. It may be a 10-key keyboard or push button switch. Numeral 23 denotes a clock pulse generator circuit which generates a train of clock pulses as shown in FIG. 4(C), and it is constituted of a stable oscillator such as a crystal oscillator and associated circuits. Numeral 24 denotes an AND gate which controls the supply of the clock pulses C, 25 denotes a programmable counter which counts the clock pulses C a count of which counter is programmable and produces a count output as shown in FIG. 4(H) when the content of the counter reaches the programmed count, numeral 26 denotes a flip-flop which forms a latch circuit to produce a signal which is used as a base signal to generate the constant amplitude voltage $-V_2$, numeral 27 denotes a memory which converts signals indicative of the period T during which the constant amplitude voltages $-V_2$ is applied and which period differs as the channels differ into digital signals and stores those digital signals, numeral 28 denotes a counter programming circuit which translates the signal read out of the memory 27 and applies the translated signal to the programmable counter 25 as a programming input, numeral 29 denotes a channel memory which stores the channel number applied from the channel specifying device 22 and specifies a readout address of the memory 27 in accordance with the channel number, numerals 30 denotes a channel indication circuit for indicating the channel number by a numeric display tube or the like in response to the output of the channel memory 29, numeral 31 denotes a control circuit for controlling the operation of the above circuits in response to the channel specifying input. The control circuit 31 includes an OR gate 32, a T-type flip-flop 33, monostable multivibrators 34 and 35, and an R-S type flip-flop 36.

The digital signals to be stored in the memory 27 may be predetermined in the following manner. As an example, a change rate of the frequency control voltage from the voltage sweeping circuit 7 during the time period T during which the constant amplitude voltage $-V_2$ is applied is set to x volts per cycle of the clock pulses C, $V_L/x$ which is obtained by dividing the channel end voltage $V_L$ volts required for the respective channel by x volts, that is; the number of clock pulses required to produce the channel end voltage $V_L$ is calculated beforehand, and this number is converted to the digital signal and is stored at an address in the memory 27 which address differs as the channels differ. In this case, the counter programming circuit 28 may apply the digital signal read out of the memory without modifying the signal to the programmable counter 25 and program the counter 25 into the same state.

Instead of storing the binary digital signals indicative of the channel end voltage $V_L$ in the PROM without modifying the digital signals, as described above, the signals to be stored may be compacted by an orthognal transform such as a Hadamard transform or other transform using a correlation existing among the channel end voltages $V_L$ of the respective channels and a correlation existing between local oscillation applied voltages for the respective tuners and characteristics of local oscillation frequencies, such as the relation of monotone increasing or decreasing function, and the compacted data are stored in the memory 27 comprising the PROM.

As a specific example, the number of clock pulses required for the respective channel end voltages $V_{L1}$, $V_{L2}$, ..... $V_{Ln}$ is represented by a vector $(V_{Li})$, which is transformed by the Hadamard matrix (H) to a vector $(X_i)$, that is, $(X_1, X_2, ..... X_n)$ and the results of the transformation are then stored in binary form. Namely;

$$(X_i) = (H)(V_{Li}) \quad (1)$$

By the nature of the Hadamard transform that by making such as this transformation values of a small number of $X_i$ become very large in comparison with values of the other $X_i$ and values of the other $X_i$ become relatively small, it is possible to make those $X_i$ which have small values be stored in a memory of small capacity to reduce the memory capacity of the memory 27. Furthermore, from the nature of energy conservation during the transform, that is;

$$\sum_{i=0}^{n-1} |V_{Li}|^2 = \frac{1}{n} \sum_{i=0}^{n-1} |X_i|^2 \quad (2)$$

and the above nature that the values of a small number of $X_i$ are very large in comparison with the values of other $X_i$, the original $V_{L1}$, $V_{L2}$..... can be obtained with fairly high accuracy by storing accurate information as for those $X_i$ having large values, storing values of $X_i$ as for those $X_i$ which have small values in a relatively inaccurate but inexpensive memory such as a ROM, and reverse Hadamard transforming the stored information $(X_i)$ into $(V_{Li})$. It should be noted, however, that a factor of $1/n$ should be multiplied during the reverse transform. Namely;

$$(V_{Li}) = 1/n \, (H)(X_i) \quad (3)$$

During the period in which the signal C is at high level, the transistor 13 conducts and the collector potential thereof becomes 0 volts, assuming that the collector voltage during the conduction of the transistor is negligible. Accordingly, the output of the voltage subtractor 14 becomes $-V_2$, which is applied to the voltage integrator 19 as the input voltage $V_S$. Assuming that the capacitance of the integration capacitor 17 is C, the resistance of the integration resistor 18 is R, the pulse width of the signal C is T, and the amplification factor of the operational amplifier is sufficiently high, the channel end voltage $V_L$ is given by;

$$V_L = -\frac{1}{CR} \int_0^T V_S dt = \frac{V_2}{CR} \times T \quad (4)$$

It is assumed, for the convenience of explanation, that the amplification factor of the voltage amplifier is unity.

When the local oscillation applied voltage reaches $V_L$, the transistor 13 is rendered non-conductive and the output voltage $V_1$ of the power supply 10 is applied to the collector of the transistor 13. Thus, the input voltage $V_S$ of the voltage integrator 19 becomes equal to $V_1-V_2$. The sweep rate of the integrator output is reduced and this condition continues until the local oscillation applied voltage reaches $V_C$.

$V_C$ is a received carrier voltage and it is given by;

$$V_C = -\frac{1}{CR} \int_{t_1}^{t_2} (V_1 - V_2) dt + \frac{V_2}{CR} \times T \quad (5)$$

When the local oscillator applied voltage reaches $V_C$, the frequency discriminator 4 produces the output $V_1$ as shown in FIG. 3. As described above, the transistor 12 is rendered non-conductive at this time and the scanning tuning system operates in the closed loop mode, and after the lapse of a certain transient state it goes into a tuned state. The local oscillation applied voltage at this moment is a tuning voltage which is used to select the channel specified by the channel specifying device 22.

It should be understood that, the numbers of clock pulses or the channel end voltage $V_L$ may be stored in the memory 27 by other means. However, when storing such converted information, it is of course necessary to reversely convert the stored signal read out of the specified address of the memory 27, by the counter programming circuit 28 before it is used to program the programmable counter 25.

The operation of the above construction will now be explained. In selecting a channel, when an operator specifies a channel number of a desired channel by, e.g., a 10-key keyboard of the channel specifying device 22, a channel specifying signal which may be a four-bit parallel binary coded decimal (BCD) signal is produced. In case of selecting a television channel where the channel number is of two digits up to 99, the keyboard is operated twice to produce two four-bit parallel signals.

The channel number represented by the two-digit BCD from the channel specifying device 22 is stored in the channel memory 29 which is constituted with a shift register etc. the contents of the shift register are applied to the channel indicator 30 which indicates the channel number and is also applied to the memory 27 which is constituted with a programmable memory (PROM) etc. as an address signal for read out. A digital signal corresponding to the channel end voltage $V_L$ of the specified channel is read out of the memory 27 in accordance with the address signal and this digital signal is applied through the counter programming circuit 28 to the programmable counter 25 to program this counter.

On the other hand, the two-digit channel specifying signal from the channel specifying device 22 is applied to the OR gate 32 in the control circuit 31 to produce two pulses as shown in FIG. 4(D). The two pulses D are applied to the T-type flip-flop 33, the output of which is differentiated to produce a clear signal E.

The clear signal E is used to reset all of the circuits at the start of the channel selection. The clear signal E is applied to the R-S flip-flops 26 and 36 and the programmable counter 25 to clear them, and thereby the Q outputs F and G of the flip-flops 26 and 36 and the output H of the programmable counter 25 are cleared to low level. The clear signal E is also applied to the monostable multivibrator 34 as a trigger signal to trigger the multivibrator and causes the monostable multivibrator 34 to produce a channel selection command signal I, which in turn sets the R-S flip-flop 26 and makes the output F of the terminal Q thereof high level.

As a result, the transistor 13 is rendered conductive by the output F of the terminal Q and starts to apply a drive voltage of $-V_2$ to the voltage integrator 19. However, since the transistor 20 is still conducting at this time as will be described later, the voltage sweep operation is not started.

At the same time, the output of the terminal $\overline{Q}$ of the R-S flip-flop 26 is changed to low level by the channel selection command signal I, and this output is differentiated to produce a trigger signal as shown in FIG. 4(J), which in turn triggers the monostable multivibrator 35 to produce a sweep voltage reset signal as shown in FIG. 4(K). The sweep voltage reset signal K is applied to the transistor 20 to render it conductive at the start of the channel selection to discharge the integration capacitor 17 to reset the sweep voltage. Therefore, the pulse width of the reset signal K is set to be long enough to fully discharge the capacitor 17.

As mentioned above the reset operation of the circuits at the start of the channel selection is completed, and from the time to at which the reset signal K terminates, the transistor 20 is rendered now-conductive and a high speed voltage sweep operation starts for a period T until the time $t_1$. Thus, the sweep voltage A starts to rise rapidly.

At the time $t_o$ when the reset signal K from the single-shot multivibrator 35 terminates and the output of the $\overline{Q}$ terminal is reversed, this output is differentiated to reset the R-S flip-flop 36 and the output of the Q terminal is changed to high level as shown in FIG. 4(G) to produce a signal which commands the counting of the clock pulses C for detecting the end $t_1$ of the period T. The count command signal G is applied to the AND gate 24, which gates the clock pulses C from the clock pulse generating circuit 23, as shown in FIG. 4(L), to the programmable counter 25. Thus, the programmable counter 25 starts to count the clock pulses C and when the content of the counter 25 reaches the count which has been programmed in accordance with the specified channel number, the counter 25 produces a detection signal (borrow signal) as shown in FIG. 4(H). The time of the occurrence of the detection signal H is the end time $t_1$ of the period T, and the output voltage of the voltage sweep circuit has reached the channel end voltage $V_L$ of the specified channel at this time. Accordingly, the flip-flop 26 is reset by the detection signal H so that the output F of the Q terminal thereof is reversed to low level, which in turn render the transistor 13 non-conductive to terminate the voltage sweep operation by the voltage $-V_2$. Thereafter, the sweep operation by the voltage $(V_1-V_2)$ in the specified channel is conducted.

At the same time, the flip-flop 36 is reset by the detection output H of the programmable counter 25 and the count command signal G is changed to low level, which in turn closes the AND gate 24 to stop the supply of the clock pulses C.

Thereafter, the frequency sweep in the specified channel is conducted in the normal sweep mode as described above, and when the broadcast signal is received at the time $t_2$, the circuit is changed to the automatic frequency control operation mode to receive the broadcast signal of that channel in a stable manner.

In this way, by counting the clock pulses C by the programmable counter 25, it is possible to readily and accurately detect the end of the period T during which the voltage is swept at high speed until the channel end voltage of the specified channel is reached. Furthermore, since it is so made that the counts value of the programmable counter 25 is stored in the memory 27 in making the count values to correspond to the channel numbers and the count value is read out from the memory 27 by specifying the channel number to program the programmable counter 25, the programming can be made with ease and the construction of the programmable counter can be simplified.

Furthermore, although the apparatus is of the scanning tuning type, the channel end voltage of the specified channel is generated by the high speed sweep using the information of the specified channel number and then the normal search tuning operation is conducted to select the broadcasting signal of the specified channel. Therefore, there will be no risk of selecting a broadcasting signal of another undesired channel and the specified channel can be exactly selected.

Moreover, since the tuning is carried out by specifying the channel number, the channel number can be indicated by the channel indicator 30 using the signal for specifying the channel stored in the channel memory 29. Therefore, the channel number indication, which has been difficult to attain in the prior art scanning tuning type apparatus, can be attained readily.

So far as the channel number is stored in the channel memory 29 in the form of binary data, an ordinary display device which converts the data to an appropriate form for display and drives a numeric display tube or liquid crystal display may be used for the channel indicator 30.

The programmable counter 25 used in the present invention may be a commonly used one in which an initial state of the counter is set to any desired count by an external program input, and the content of the counter is decremented or incremented by one for each count of a clock pulse and after the counter has counted the clock pulses by the programmed number, the content of the counter reaches a predetermined state, e.g., "0" count to produce an output. Further, any other programmable counter may be used such as a counter in which an external program input is stored in a register and the clock pulses are counted by a separate counter. The content of the register and the content of the counter are compared in a comparator to produce a detection output when both contents match.

In the above embodiment, in order to sweep the voltage initially to the channel end voltage $V_L$, the transistor 13 connected to the positive input terminal of the voltage subtractor 14 is rendered conductive to clamp the positive input terminal to ground potential so that the voltage $-V_2$ is applied to the voltage integrator 14. However, any other means for sweeping the voltage to the channel end voltage $V_L$ may be used provided that it satisfies the requirement that it maintains the voltage sweep for the period T irrespective of the fact that the frequency discriminator 4 may produce the discrimination output when the other broadcasting signal of undesired frequency is received. As an example, means for sweeping the voltage in which by means of a signal of the duration T derived by counting the clock pulses a switching means is switched and a constant voltage is applied to the input terminal of the voltage sweeping circuit 7 through the switching means, or means for sweeping the voltage whose construction is such as that shown in FIG. 2 and a switching means such as the transistor 13 is provided in series with the plus input terminal of the voltage subtractor 14, and the switching means is switched off by the signal of the duration T so that the voltage from the transistor 12 and the low pass filter 5 may not be transmitted.

Furthermore, in the above embodiment, since the flip-flops 26 and 36 and the programmable counter 25 are cleared by the clear signal E produced when the channel is specified, the specifying of the channel can be conducted correctly at any time. However, the clearing operation need not always be carried out. In such a case when clearing is not carried out, however, if it is so made that the next channel will be specified after the voltage sweep and scanning tuning operation for the previous channel has been completed erroneous operation does not occur.

When the internal resistance of the transistor 20 for resetting the sweep voltage during the conduction thereof is low enough to discharge the capacitor 17 in a very short time, the generation of the sweep voltage reset signal K by the single-shot multivibrator 35 is not required, and it may be so made that the transistor 20 is rendered conductive by the clear signal E. In this case, the flip-flop 36 is set by the clear signal E.

In the above embodiment, the channel selection is started when the two-digit signal is applied by the channel specifying device 22 such as the keyboard. However, the channel specifying device 22 may be another channel switching means such as a rotary switch. In this case, the channel selection is started when the channel specifying signal is inputted from the channel specifying device 22 or the switch position is changed, and at the same time the clear signal E or the channel selection command signal I is produced.

As a means for producing the sweep command signal F for sweeping to the channel end voltage $V_L$, any latch circuit may be used instead of the flip-flop 26.

In the above explanation, under the constant voltage $-V_2$, the voltage sweeping operation is conducted to the channel end voltage $V_L$ corresponding to the channel end frequency of the specified channel, and thereafter an accurate sweeping operation is conducted. The present invention, however, may be constructed such that with the constant voltage $-V_2$ the voltage sweep operation is conducted directly to the channel voltage corresponding to the broadcasting frequency of the specified channel and thereafter the automatic frequency control mode of operation is immediately conducted. The operation of the device with such construction will be the same as that shown in the above description changing the "channel end" in the description to "channel" and removing the voltage comparator 9, the power supply 10 and the circuit of the transistor 12 and the power supply $V_1$.

In the channel selection apparatus described above, the temperature drift of the integration constant CR, that is, the capacitance C of the capacitor 17 and the resistance R of the resistor 18, as well as the integration voltage $V_2$, is not at all compensated. A channel selection apparatus in which the channel boundary voltage of the channel to be selected is used as information with respect to the channel number and in order to obtain such a channel boundary voltage, the constant input voltage $V_2$ is integrated by a voltage integrator for the integration period T determined by the channel to be selected, and a calibrated integrated period $T_2$ is used as the integration period T to compensate for the temperature drift of the integration constant CR and the voltage $V_2$, will now be described.

In FIG. 5, the like parts to those in FIG. 2 are represented by like reference numerals. The operation from the specifying of the channel number of the desired channel by the channel specifying device 22 such as the 10-key keyboard (FIG. 7(A)) to the generation of the channel command signal C and the operation of applying the address signal to the memory 27 and the counter programming circuit 28 are the same as those described above. In the present embodiment, the clear signal B from the output of the flip-flop 33 is applied to the monostable multivibrator 34 and to the clear terminals of the S-R flip-flops 26, 37, the programmable counter 25, the counter 38, and the S-R flip-flops 36, 39 and 40. The clear signal B resets the Q output of the S-R flip-flop 37 to "0" level, the contents of the counter 38 to 0, the Q output of the S-R flip-flop 39 to "0" level, and the Q output of the S-R flip-flop 40 to "0" level. The "0" level signal from the Q output of the S-R flip-flop 40 is applied to the R input of the S-R flip-flop 37. When the channel selection command signal C, i.e., "1" level signal is then applied from the single-shot multivibrator 34 to the S input of the S-R flip-flop 37, the Q output of the S-R flip-flop 37 changes to "1" level while the $\overline{Q}$ output changes to "0" level.

The "1" level Q output L of the S-R flip-flop 37 is applied through the OR gate 41 to the base of the transistor 13 to render it conductive. Thus, the collector potential of the transistor 13 becomes ground potential so that the voltage subtractor 14 produces $-V_2$ output voltage.

On the other hand, the $\overline{Q}$ output of the S-R flip-flop 37 is differentiated by a differentiation circuit 42 to produce a pulse M for driving a monostable multivibrator 43. The Q output N of the single-shot multivibrator 43 is applied through an OR gate 44 to the base of the transistor 20 to render it conductive and the capacitor 17 is discharged. The pulse width of the Q output is selected to be long enough to completely discharge the capacitor 17 so that the output voltage of the voltage amplifier 21 assumes a ground potential. At the trailing edge of the Q output N, that is, at the time $t_o$ shown in FIG. 6, the transistor 20 is rendered non-conductive.

Since the constant voltage $-V_2$ is applied to the input terminal of the voltage integrator 19 and the transistor 20 becomes non-conductive, the output of the voltage integrator 19 rises at a constant gradient. The integration period $T_1$ is used to calibrate the capacitor 17, the resistor 18 and the voltage $V_2$.

The $\overline{Q}$ output of the single-shot multivibrator 43 is differentiated by a differentiation circuit 45 to produce a signal 0 which is applied to the S input of the S-R flip-flop 39. When the input signal 0 is applied to the S input of the S-R flip-flop 39, the Q output of the S-R flip-flop 39 is changed to "1" level, which is applied to an AND gate 46, which in turn gates the clock pulses from the clock pulse generating circuit 23 to cause the counter 38 to count the clock pulses.

The time of the trailing edge of the output of the single-shot multivibrator 43, that is, the time at which the input 0 is applied to the S input of the S-R flip-flop 39 is indicated by $t_o$. The output voltage of the voltage integrator 19 increases from the time $t_o$ at a constant gradient $\tau$. Assuming that the amplification factor of the voltage amplifier 21 is unity, the integrated voltage of the voltage integrator 19 is equal to the voltage applied to the local oscillator for sweeping starting at the time $t_o$ shown in FIG. 6.

This sweep voltage is compared in a voltage comparator 47 with an output voltage $V_r$ of a diode 48 which forms a reference power supply. When the sweep voltage reaches the output voltage $V_r$, the voltage comparator 47 produces a "1" level output, which is applied to the R input of the S-R flip-flop 39 to change the Q output Q thereof to "0" level. This time is indicated by $t_1$ in FIG. 6. Thus, the AND gate 46 is closed and the clock pulses from the clock pulses generating circuit 23 are no longer applied to the counter 38. Thus, the counter 38 stops counting and the content at that moment is stored.

The output P of the voltage comparator 47 is also applied to the S input of the S-R flip-flop 26. By the output P, the Q output of the S-R flip-flop 26 is changed to "1" level. Therefore, the transistor 13 is kept conductive. The output P is further applied to the R input of the S-R flip-flop 40 to change the Q output of the S-R flip-flop 40 to "0" level. This Q output resets the S-R flip-flop 37 to change the Q output thereof to "0" level. This state is maintained until the next channel selection operation. The $\overline{Q}$ output of the S-R flip-flop 37 is applied to the S input of the S-R flip-flop 40 in order to maintain the S input of the S-R flip-flop 40 to "0" level for the calibrating integration period $T_1$ to allow the signal P to reset the S-R flip-flop 40.

The operation during the calibrating integration period $T_1$ has been described. The output P of the voltage comparator 47 which occurs at the trailing edge of the calibrating integration period $T_1$, i.e., at the time $t_1$, may be considered to correspond to the channel selection command signal I in FIG. 2. where the output of the single-shot multivibrator 34, i.e., the channel selection command signal I has been applied to the S input of the S-R flip-flop 26. Thus, the operation of FIG. 6 after the time $t_1$ is similar to the operation described in connection with FIG. 4, except that the integration period T in FIG. 4 is now an integration period to be calibrated $T_2$ in FIG. 6.

A method for determining the integration period to be calibrated $T_2$ is now explained. Although the integration constant CR determined by the capacitance C of the capacitor 17 and the resistance R of the resistor 18 in FIG. 5 is fixed, the input voltage $V_2$ applied to the voltage integrator 19 can be changed by a potentiometer 50. Accordingly, the gradient $\tau = V_2/CR$ of the sweeping voltage is variable.

In the manufacturing plant, the gradient $\tau$ is adjusted at the time of the manufacture to the following value;

$$\tau = V_2/CR = V_r/T_r \tag{6}$$

where $V_r$ is a reference voltage and $T_r$ is a reference integration period. The above equation can be rewritten as follows;

$$V_r = V_2/CR \times T_r \tag{7}$$

When a television receiver set including the channel selection apparatus is forwarded or shipped from the manufacturing plant and is installed at a certain place, since the ambient temperature of the television receiver set usually differs from that in the manufacturing plant the integration constant CR and the integration input voltage $V_2$ may drift. Assuming that the values after the drift are $C'R'$ and $V_2'$, respectively, and the gradient of the voltage sweep after the drift is $\tau'$;

$$V_r = \frac{1}{C'R'} \int_{t_o}^{t_1} V_2' dt = \frac{V_2'}{C'R'} \times T_1 \qquad (8)$$

where $T_1$ is a time period required for the local oscillator applied voltage to reach the reference voltage $V_r$.

From the equations (7) and (8), $$T_1/T_r = V_2/CR \times C'R'/V_2' = \tau/\tau' \qquad (9)$$

Namely, the ratio of the integration periods $T_1/T_r, \tau/\tau'$ which is is an inverse ratio of the gradients. Similarly, at the same ambient temperature as that at the adjustment in the manufacturing plant;

$$V_X = V_2/CR \times T_X \qquad (10)$$

where $V_2$ is a channel end voltage and $T_X$ is an integration period corresponding to $N_X$ which is the channel lower end voltage stored after being analog-to-digital converted. At the time of the receiving operation, the voltage applied to the local oscillator is swept from $t_2$ to $t_3$ to obtain the channel end voltage $V_L$. In representing this period by $T_2$, $$V_L = \frac{1}{C'R'} \int_{t_2}^{t_3} V_2' dt = \frac{V_2'}{C'R'} \times T_2 \qquad (11)$$
$$= \tau' \times T_2$$

Since $V_X = V_L$, from the equation (10) and (11),
$$T_2/T_X = V_2/CR \times C'R'/V_2' = \tau/\tau' \qquad (12)$$

From the equations (9) and (12),
$$T_1/T_r = T_2/T_X \qquad (13)$$

Accordingly, $$T_2 = T_1/T_r \cdot T_X \qquad (14)$$

Accordingly, $$V_L = V_2'/C'R' \times T_2 = V_2'/C'R' \times T_1/T_r \times T_X \qquad (15)$$

It is thus seen that by obtaining the calibrating integration period $T_1$ shown in FIG. 6, dividing it by the reference integration period $T_r$ and using the quotient as a factor to calibrate the stored integration period $T_X$, the channel lower end voltage $V_L$ can be determined even if the integration constant CR and the integration input voltage $V_X$ drift.

Assuming that the reference integration period is $T_r$, the calibrating integration period $T_1$, the stored integration period $T_X$, and the digital values corresponding to the calibrated integration period $T_2$ are reference gate pulses $N_r$, calibrating gate pulses $N_1$, stored gate pulses $N_X$ and calibrated gate pulses $N_2$, respectively, $N_2$ is given from the equation (14) by the following equation;

$$N_2 = N_1/N_r \cdot N_X \qquad (16)$$

In order to determine $N_2$, $N_1$ is first determined, then $N_1$ is divided by a predetermined number $N_r$, and the quotient is multiplied with the stored $N_X$.

$N_r$ is the number of clock pulses generated during the time in which the frequency control voltage becomes $V_r$ when there is no temperature drift. $N_r$ is obtained by dividing the reference voltage $V_r$ by a voltage $V_u$ per clock pulse cycle. The number of pulses $N_r$ is previously stored in the operation unit 49.

$N_1$ is the number of clock pulses generated during the calibration period carried out before initiating the channel selection operation. Since the number $N_1$ is determined during a period in which there may be temperature drift, the number of pulses $N_1$ generated during the time it takes for the frequency control voltage to become $V_r$ may be different from $N_r$. $N_1$ is obtained as a digital value which has been counted by the counter 38 and stored therein by the operation described above.

$N_x$ is the number of clock pulses generated during the time in which the frequency control voltage becomes the channel lower end voltage $V_L$ of each desired channel when there is no temperature drift. $N_x$ is obtained by dividing the channel lower end voltage $V_L$ of the desired channel by the voltage $V_u$ per clock pulse cycle. The numbers of the clock pulses $N_x$ are stored in the memory (PROM) 27 and are different for every channel.

$N_2$ if the number of clock pulses actually required for selecting a channel. $N_2$ is obtained in an operation unit 49 through the calculation shown in equation (16). By using $N_2$, a channel lower end voltage which is not affected by temperature drift can be obtained.

That is, the solution of equation (16) is carried out in the operation unit 49 to which the output of the counter programming circuit 28 is applied, and the result of the calculation is applied to the data terminal of the programmable counter 25. The operation unit 49 comprises a memory for storing $N_r$, a division circuit for dividing $N_1$ represented by the signal inputted from the counter 38 by the value of $N_r$ read out of memory, and a multiplication circuit for multiplying $N_1/N_r$ outputted from the division circuit by $N_x$ represented by the signal inputted from the counter programming circuit 28 and producing a signal representing $N_1 \times N_x/N_r$ which is supplied to the programmable counter 25.

The accuracy of $N_r$ and $N_1$ depends on the accuracy of the outputs of the clock pulse generator circuit 23 and the diode 48 of the reference power supply. Accordingly, if the accuracy of the latter is sufficiently high, an exact channel lower end voltage $V_L$ can be provided.

Figure 7:
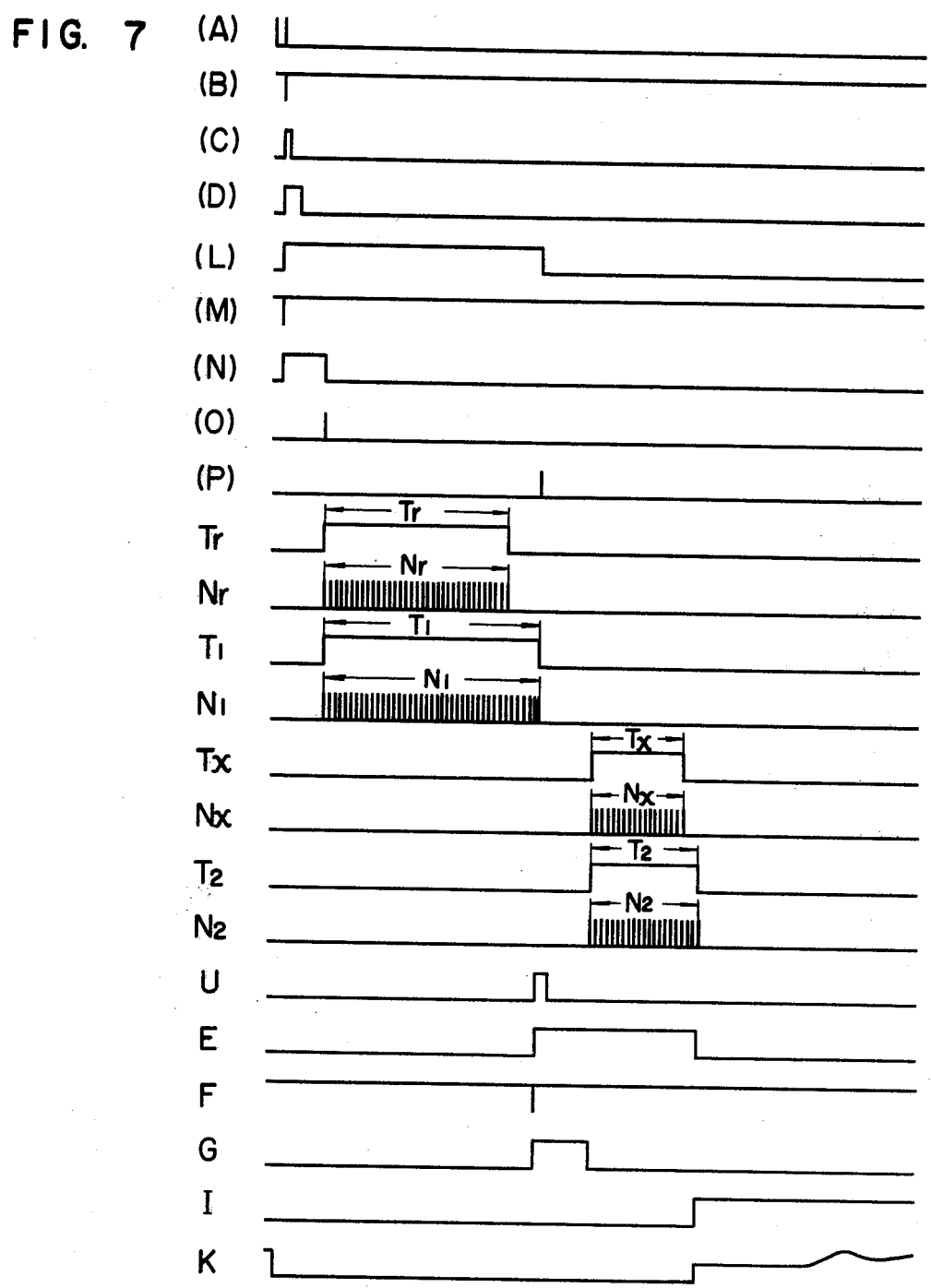

In FIG. 7, U represents the operation period of the operation unit 49, E represents the drift period of the transistor 13, F represents the input signal to the monostable multivibrator 35, G represents an output signal of the monostable multivibrator 35, I represents the output signal of the voltage comparator 9, and K represents the input signal of the voltage integrator 19.

Commercially available capacitors and resistors have a temperature drift on the order of $\pm 100$ ppm/° C. and hence the temperature characteristics of the capacitor 17, resistor 18 forming the integration circuit and the potentiometer 50 for adjusting the voltage $V_2$ cannot be neglected. With the channel selection apparatus of the present invention, the channel lower end voltage of the desired channel can be obtained without being affected by the temperature drift of the capacitor 17, the resistor 18 and the potentiometer 50. In the present apparatus, the accuracy of the reference voltage $V_r$ from the diode 48 of the reference power supply and the reference frequency from the clock pulse generating circuit 23 for determining the calibrating integration period $T_1$, are the only factors which one may bring into question. However, when a stabilized IC for a television receiver electronic tuner is used as the reference power supply, it is easy to attain an accuracy on the order of ±30 ppm/° C. Furthermore, when the clock pulse generator circuit of the reference oscillator is crystal controlled, it is easy to attain an accuracy on the order of ±30 ppm over the temperature range of −10° C. to +70° C. All of these circuits are relatively inexpensive.

What is claimed is:

1. A channel selection apparatus comprising
   a local oscillator including a voltage dependent tuning element,
   a voltage sweep circuit for applying a sweep voltage to said turning element, said local oscillator generating a sweep frequency output in response to said sweep voltage,
   a sweep control circuit for coupling a reference voltage source to said voltage sweep circuit during generation of said sweep voltage output,
   means coupling said sweep control circuit to the output of said local oscillator,
   a channel specifying device for generating a signal corresponding to a selected channel,
   memory means coupled to said channel specifying device, said memory means having stored therein a plurality of digital signals each consisting of a unique number of pulses $N_x$ corresponding to one of said channels, one of said digital signals being read out of said memory means in response to a channel selection by said channel specifying device,
   a reference frequency generating circuit for generating voltage pulses at a reference frequency,
   a programmable counter coupled to said memory means and said reference frequency generating circuit, said programmable counter being programmed by said memory means and generating at its output a pulse signal corresponding to the digital signal at the output of said memory means for determining the period of the sweep voltage required for said voltage sweep circuit to reach a voltage corresponding to the frequency of the specified channel, and
   a sweep change circuit coupling said programmable counter to said sweep control circuit, said sweep change circuit changing the input signal to said sweep control circuit upon receipt of the pulse signal at the output of said programmable counter when said sweep voltage has reached a value corresponding to the frequency of the specified channel.

2. A channel selection apparatus according to claim 1 which further comprises a high frequency amplifier for receiving and amplifying a high frequency input signal, and wherein said means coupling said sweep control circuit to the output of said local oscillator includes
   a mixer for mixing the output of said high frequency amplifier and the output of said local oscillator,
   an intermediate frequency amplifier coupled to the output of said mixer, and
   a frequency discriminator coupling the output of said intermediate frequency amplifier to the input of said sweep control circuit, said mixer, intermediate frequency amplifier, frequency discriminator, sweep control circuit, voltage sweep circuit and local oscillator forming a loop circuit, the output of said voltage sweep circuit being changed until the output frequency of said local oscillator reaches the lower end frequency of the specified channel and the voltage applied to said frequency discriminator is within the frequency lock range thereof, said frequency discriminator being thereby swept from a voltage corresponding to the lower end frequency of the specified channel to a voltage corresponding to the intermediate frequency amplifier output signal for the specified channel.

3. A channel selection apparatus according to claim 2 wherein said sweep control circuit includes a voltage subtractor having one input terminal coupled to a constant voltage source and the other input terminal coupled to the output of said frequency discriminator for automatic frequency control, said other input terminal being connected to a constant potential through a switching element of said sweep change circuit during said sweep period.

4. A channel selection apparatus according to claim 1 which further comprises
   a voltage comparator for comparing the output of said voltage sweep circuit and said reference voltage source,
   a calibrating sweep period determination circuit coupled to the output of said voltage comparator to generate a signal when the output of said voltage sweep circuit equals the voltage of said reference voltage source,
   a counter coupled to said calibrating sweep period determination circuit and said reference frequency generating circuit for counting the pulse generated at said reference frequency during the calibrating sweep period determined by said calibrating sweep period determination circuit, and
   an operation unit for storing the number of clock pulses $N_r$ generated at the output of said counter during the calibrating sweep period when there is no temperature drift and coupling said memory means and said counter to said programmable counter, said operation unit dividing the number of clock pulses $N_1$ generated at the output of said counter during the calibrating sweep period when there may be a temperature drift by the number of clock pulses $N_r$ stored in said operation unit, said operation unit further multiplying the quotient $N_1/N_r$ by the number of pulses $N_x$ corresponding to a selected channel stored in said memory means to produce a number of output pulses $N_2$, said programmable counter being programmed by the output of said operating unit to determine the period of the sweep voltage required for said voltage sweep circuit to reach a voltage corresponding to the frequency of the specified channel.

5. A channel selection apparatus according to claim 4 which further comprises a high frequency amplifier for receiving and amplifying a high frequency input signal, and wherein said means coupling said sweep control circuit to the output of said local oscillator includes
   a mixer for mixing the output of said high frequency amplifier and the output of said local oscillator,
   an intermediate frequency amplifier coupled to the output of said mixer, and
   a frequency discriminator coupling the output of said intermediate frequency amplifier to the input of said sweep control circuit, said mixer, intermediate frequency amplifier, frequency discriminator, sweep control circuit, voltage sweep circuit and local oscillator forming a loop circuit, the output of said voltage sweep circuit being changed until the output frequency of said local oscillator reaches the lower end frequency of the specified channel and the voltage applied to said frequency discriminator is within the frequency lock range thereof, said frequency discriminator being thereby swept from a voltage corresponding to the lower end frequency of the specified channel to a voltage corresponding to the intermediate frequency amplifier output signal for the specified channel.

6. A channel selection apparatus according to claim 5 wherein said sweep control circuit includes a voltage subtractor having one input terminal coupled to a constant voltage source and the other input terminal coupled to the output of said frequency discriminator for automatic frequency control, said other input terminal being connected to a constant potential through a switching element of said sweep change circuit during said sweep period.

* * * * *